United States Patent [19]

Mizuno et al.

[11] 4,118,794
[45] Oct. 3, 1978

[54] MEMORY ARRAY WITH LARGER MEMORY CAPACITORS AT ROW ENDS

[75] Inventors: Fumio Mizuno, Kodaira; Masamichi Ishihara, Tokyo, both of Japan

[73] Assignee: Hitachi, Ltd., Japan

[21] Appl. No.: 851,691

[22] Filed: Nov. 15, 1977

[30] Foreign Application Priority Data

Nov. 19, 1976 [JP] Japan .................................. 51/138340

[51] Int. Cl.$^2$ ............................................... G11C 11/24
[52] U.S. Cl. ...................................... 365/149; 307/238
[58] Field of Search ................... 365/149, 205; 307/238

[56] References Cited

U.S. PATENT DOCUMENTS 3,760,381  9/1973  Yao ........................................ 365/205
4,038,646  7/1977  Mehta et al. ........................... 365/149

Primary Examiner—Stuart N. Hecker
Attorney, Agent, or Firm—Craig & Antonelli

[57] ABSTRACT

A memory cell of a dynamic storage device is composed of a MOSFET and a capacitor. On a single semiconductor substrate, a plurality of such memory cells are regularly arranged so as to form a plurality of columns, with the result that they constitute a memory cell array or a memory cell mat. The capacitor for the memory cell is made up of a semiconductor region of the type which possesses a conductivity opposite to that of the semiconductor substrate, and a conductor film which is formed of polycrystalline silicon or the like on the semiconductor region through a comparatively thin insulating film. The areas of the capacitors in the memory cell column situated at an end portion of the memory cell mat are made larger than those of the capacitors of the memory cells at an inner or central portion of the memory cell mat. The memory cells at the end portion of the memory cell mat come to have information holding times equivalent to those of the memory cells at the central portion of the memory cell mat.

3 Claims, 16 Drawing Figures

MEMORY ARRAY WITH LARGER MEMORY CAPACITORS AT ROW ENDS

BACKGROUND OF THE INVENTION

This invention relates to a semiconductor memory, and more particularly to a dynamic storage device which makes use of a capacitor as means for accumulating information.

A memory employing metal-insulator-semiconductor field effect transistors (MISFET's) represented by the so-called MOS (metal-oxide-semiconductor) FET's can easily exploit the dynamic storage action of a capacitor or a stray capacitance, and is therefore used in large numbers from the viewpoints of raising the density of integration, lowering the price, etc. Among the MOS memories, one which has recently been highlighted most is the so-called 1 Trs/cell memory (termed "1-element memory" hereafter) employing one MOSFET and capacitor per bit as, for example, published in 'ISSCC Digest of Technical Papers,' pp. 140-141, February, 1976 by K. Itoh et al. Stored information in the 1-element memory is read out to a data line by bringing the MOSFET of the memory into the "on" state. In accordance with this read-out, the potential of the data line changes in such a manner that charges having been accumulated in the capacitor of the 1-element memory are allotted to the capacitors associated with the data line. Accordingly, the potential of the data line corresponds to information stored in the 1-element memory. By impressing the potential of the data line on a "read" circuit, the stored information from the 1-element memory is read out. The 1-element memory is disadvantageous in that the "read" level of the stored information is low since the level of the data line is determined by the allotment of the charges. However, the capacitance of the capacitor can be made small by endowing the "read" circuit with a high sensitivity. The 1-element memory is advantageous in that the occupying area per bit in a semiconductor substrate can be made small as a semiconductor integrated circuit since the number of the constituent elements per bit is small.

In memories, such as the 1-element memory, of the type wherein charges accumulated in a capacitor and information are caused to correspond, the charges accumulated in the capacitor leak through various paths. Therefore, the "read" level which appears on the data line in reading out the stored information varies depending on the period of time of the information holding operation of the memory cell. In the memories of the type as described above, the "read" level which lowers or changes due to the leakage of the charges from the capacitor must not exceed the allowable input level of the "read" circuit, so that only a limited information holding time is exhibited. The memories of this type accordingly hold information only temporarily and are called "dynamic memories."

In the form of a semiconductor integrated circuit, a plurality of memory cells each being built up of the 1-element memory as described above are regularly arrayed in a plurality of columns on a semiconductor substrate and constitute a memory cell array or memory cell mat.

When studying the improvement in the "read" level of the 1-element memory, the inventors discovered that the information holding time of memory cells arranged at an end portion of the memory cell array is shorter by a ratio of ½-1/10 as compared with that of memory cells at an inner portion. When the information holding time is short, the cycle for rewriting or refreshing the stored information must be raised, and a serious limitation upon use is imposed on the whole memory system.

SUMMARY

A capacitor for a memory cell is made up of a semiconductor region in the surface of a semiconductor substrate, and a conductive layer which is formed on the semiconductor region through a thin oxide film serving as a dielectric. The semiconductor region is one of a conductivity type substantially opposite to that of the semiconductor substrate, for example, an inversion region which is induced in the surface of the semiconductor substrate by an electric field established by the conductive layer, or a diffused region which is formed by diffusing an impurity which determines conducting type.

In this invention, the capacitance of the capacitor for the memory cell situated at an end portion of a memory cell mat or memory cell array is made larger than that of the capacitor for the memory cell situated at a central or inner portion of the memory cell array. As a result, the memory cell holds information for a sufficiently long time even when a comparatively great leakage current arises at the end portion of the memory cell mat.

It is accordingly the principal object of this invention to lengthen the information holding time of a dynamic storage device which exploits the action of a capacitor or stray capacitance for temporarily holding information.

Another object of this invention is to provide a dynamic storage device which can lengthen the information holding time with a simple construction.

REFERENCE TO DRAWINGS

DETAILED DESCRIPTION

The decrease in the information holding time of the 1-element memory cell at the end portion of the memory cell array as described above is caused by the leakage of charge accumulated in the capacitor of the memory cell.

At the central or inner portion of the memory cell array, the plurality of memory cells are cyclically arranged in comparatively close proximity. In contrast, no other cell is arranged outside the end portion of the memory cell array, as a matter of course, and different circuit elements are arranged comparatively distantly, so that the comparatively large area of the semiconductor widens.

Therefore, a leakage current due to minority carriers etc. flowing through the vicinity of the semiconductor substrate surface outside the end portion of the memory cell array has been considered as causing the increase in the leakage current of the memory cell at the end portion, though it has not been definitely confirmed.

It has been revealed, however, that whatever the cause may be, a construction in which the capacitance of the memory cell capacitor at the end portion of the memory cell mat is made larger, as explained later, is effective in lengthening the information holding time at the end portion.

Figure 1:
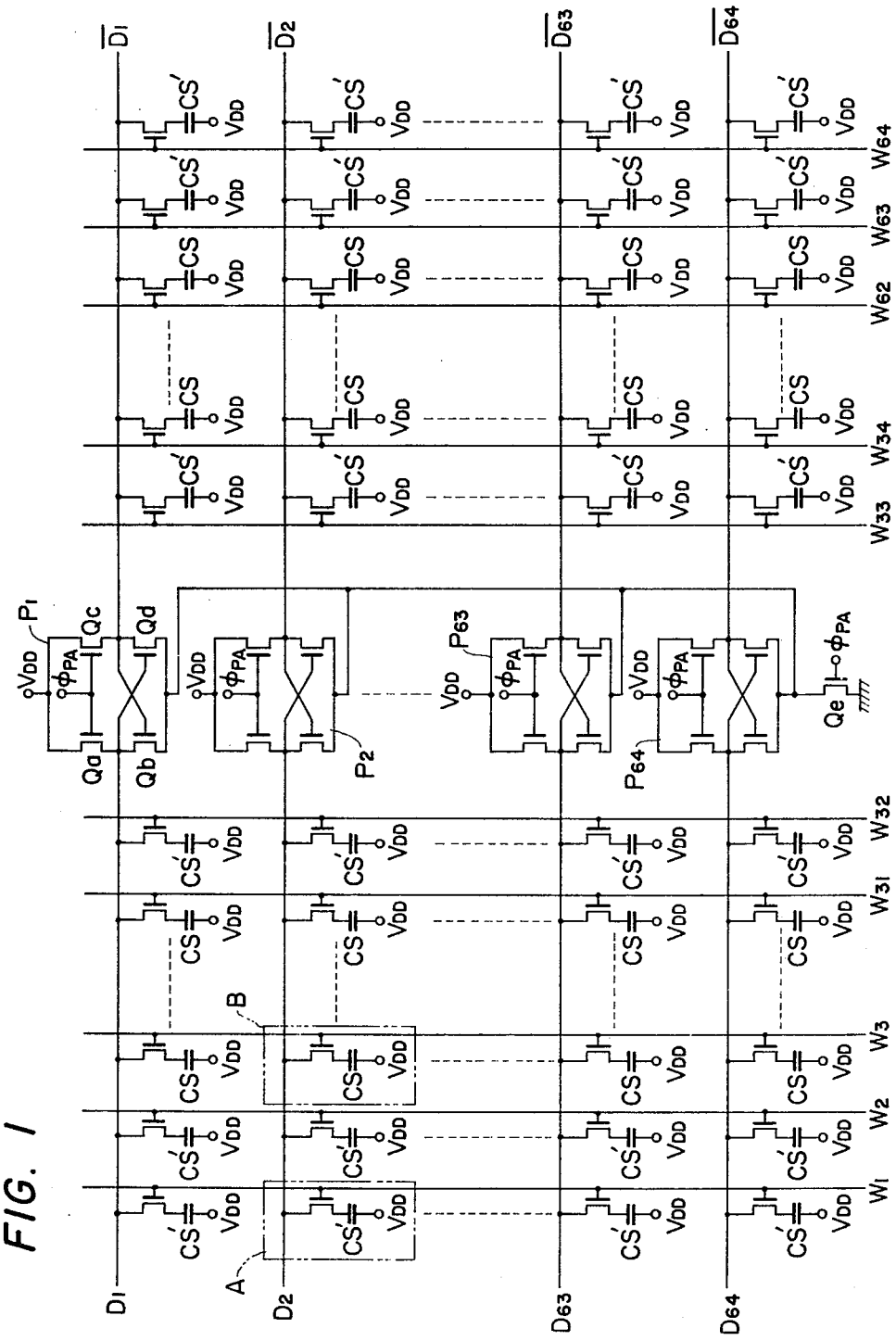
FIG. 1 is a circuit diagram of the essential portions of a dynamic storage device.

FIG. 1 is a circuit diagram showing part of a circuit which is used in a dynamic storage device embodying this invention. Referring to the figure, data lines $D_1$ and $\overline{D_1}$, $D_2$ and $\overline{D_2}$, ... and $D_{64}$ and $\overline{D_{64}}$ stretch leftwards and rightwards with respect to pre-amplifiers $P_1$–$P_{64}$ of the flip-flop arrangement each of which consists of MOS (metal-oxide-semiconductor) FET's $Q_a$–$Q_d$. Word lines $W_1$–$W_{64}$ are provided in a direction intersecting the data lines. Memory cells each of which is constructed of an FET serving as information transfer means and a capacitor $C_S$ (or $C_S'$) serving as storage means are connected at the points of intersection between the respective data lines and work lines (this group of memory cells shall be called the memory cell array hereafter).

In the circuit illustrated, thirty-two memory cells are provided on each of the data lines on both sides of one pre-amplifier, and 64 pairs of data lines are included. Therefore, a memory circuit of (32 · 2) · 64 bits, i.e., 4,086 bits is constructed.

The construction and operation of the circuit in FIG. 1 have been known from, for example, the above-mentioned paper published by K. Itoh et al. Since the circuit of FIG. 1 is not inventive in itself, it will not be explained in detail but will be briefly described. If the level of the data line, e.g., $D_1$ is made the high level and the word line, e.g., $W_1$ is selected, the FET as the transfer means attains the "on" state, and the data of this data line $D_1$ is written into the capacitor. When the FET as the transfer means is kept in the "off" state, the memory cell holds the information. If the word line, e.g., $W_1$ is selected under the state wherein the level of the data line, e.g., $D_1$ is kept at a predetermined level, the data line $D_1$ and the capacitor of the memory cell are connected by the FET which is in the "on" state. Therefore, the distribution of charges takes place between a capacitance (not shown) possessed by the data line $D_1$ and the capacitor of the memory cell, and the level of the data line $D_1$ becomes a value corresponding to the information which has been stored in the memory cell.

Although not illustrated, the circuit of FIG. 1 is provided with a word decoder for selecting the word lines $W_1$–$W_{64}$ in response to address information, circuits such as word drivers receiving outputs from the word decoder and driving the word lines $W_1$–$W_{64}$, dummy cell circuits belonging to the respective data lines $D_1$–$D_{64}$ and $\overline{D_1}$–$\overline{D_{64}}$ and endowing the respective pre-amplifiers $P_1$–$P_{64}$ with reference potentials for reading, a main amplifier for reading out the levels of the data lines as amplified by the pre-amplifiers, etc.

In a semiconductor integrated circuit device, the memory cell arrays in FIG. 1 are formed on the semiconductor substrate in substantial correspondence with the arrangement in the circuit diagram. By way of example, the plurality of memory cells connected to the word lines $W_1$ to $W_{32}$ constitute one memory cell array, while the plurality of memory cells connected to the word lines $W_{33}$ to $W_{64}$ constitute the other memory cell array. The pre-amplifiers are sandwiched between these memory cell arrays.

Figure 6:
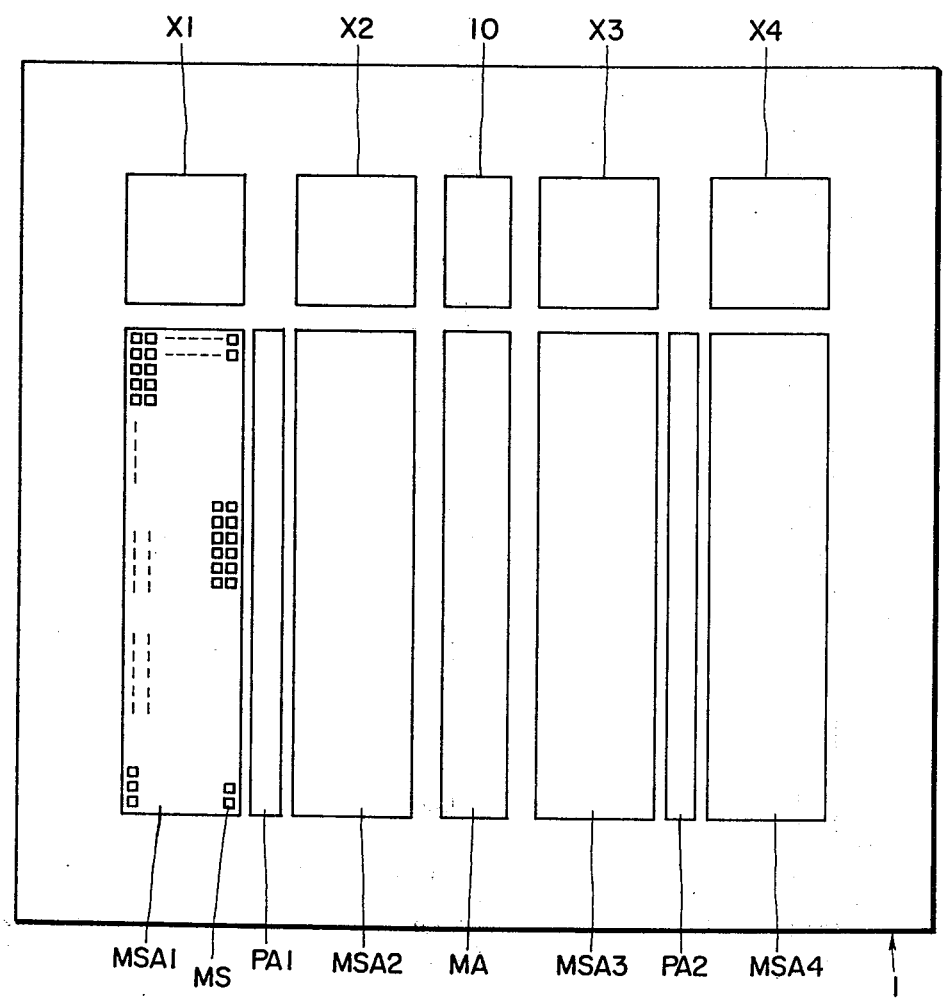
FIG. 6 is a plan view showing the arrangement of elements which constitute various circuits on a semiconductor chip.

FIG. 6 exemplifies the arrangement of various circuits on a single semiconductor substrate. Referring to the figure, a pre-amplifier PA 1 is arranged between a pair of memory cell arrays MSA 1 and MSA 2 each of which is constructed of a plurality of memory cells MS. Word decoders X 1 and X 2 for selecting word lines are respectively arranged for the memory cell arrays MSA 1 and MSA 2. Likewise, a pre-amplifier PA 2 is arranged between another pair of memory cell arrays MSA 3 and MSA 4, and decoders X 3 and X 4 are arranged for the respective memory cell arrays. A main amplifier MA is arranged for the memory cell arrays MSA 1 to MSA 4. Further, an input/output circuit I/O for the main amplifier MA is arranged.

In case of constructing the circuit of FIG. 1 into the semiconductor integrated circuit, specific memory cells connected to the word lines $W_1$, $W_2$, $W_{32}$, $W_{63}$ and $W_{64}$ are arranged at the end portions of the memory cell arrays as will be understood from a later description taken with reference to FIG. 4.

Only the memory cell enclosed in broken lines A in FIG. 1 is shown in FIG. 2A again, while only the memory cell enclosed with broken lines B is shown in FIG. 2B again.

Figure 2A:
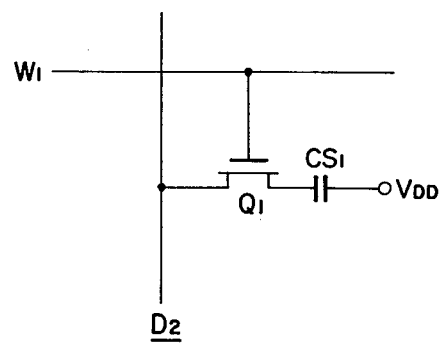
FIGS. 2A and 2B are circuit diagrams of memory cells.
Figure 2B:
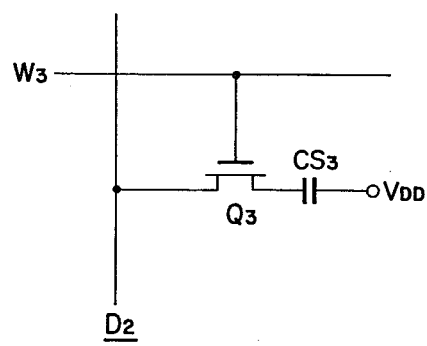

The circuits of FIG. 2A and FIG. 2B have no essential difference in the drawing. However, the memory cell illustrated in FIG. 2A is arranged at the end portion of the memory cell array, whereas the memory cell illustrated in FIG. 2B is arranged at the central or inner portion of the memory cell array.

Figures 3A, 3B:
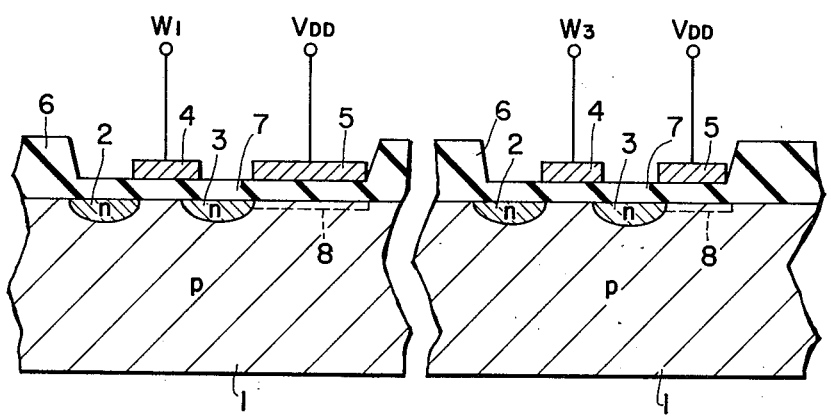
FIGS. 3A and 3B are sectional views of memory cells which are formed of capacitors having capacitances which differ from each other.

The structures of elements constituting the memory cell circuits of FIGS. 2A and 2B may be understood by referring to the sections of the semiconductor substrate shown in FIGS. 3A and 3B, respectively.

In FIGS. 3A and 3B, numeral 1 designates a p-type silicon substrate, which has a specific resistance of 10 $\Omega$·cm though no special restriction is intended. Numerals 2 and 3 designate n-type regions which have, for example, a depth of 1 $\mu$m and a sheet resistance of 30 $\Omega/\square$. The n-type regions 2 and 3 are formed in such a way that phosphorus is diffused as an impurity into the surface of the silicon substrate 1 and at a short spacing therebetween.

The regions 2 and 3 function as the drain region and source region of a MOSFET. Numeral 4 designates a gate electrode made of, for example, polycrystalline silicon. It is formed on the surface of the silicon substrate 1 between the regions 2 and 3 through a thin silicon oxide film 7 which is, for example, 700 Å thick and serves as a gate insulating film. Shown at 5 is an electrode made of, for example, polycrystalline silicon. It is formed on the silicon substrate 1 through an oxide film formed simultaneously with the oxide film 7. One end portion of the electrode 5 is located over the n-type region 3. Numeral 6 indicates a thick silicon oxide film which covers the surface of the silicon substrate 1 and which is, for example, about 1 μm thick.

A power source $V_{DD}$ applies the electrode 5 with a positive voltage of, for example, 12 volts. On the other hand, the silicon substrate 1 is applied with a negative substrate voltage of, for example, −5 volts. As the result, an intense electric field acts on the surface of the silicon substrate 1 underneath the electrode 5, and a channel layer 8 formed of an inversion layer as indicated by broken lines is induced. This layer of the substantially opposite conductivity type connects with the n-type region 3 because one end of the electrode 5 overlies the n-type region as described above.

The electrode 5 and the channel layer 8 form a capacitor whose dielectric is the thin oxide film. In consequence, the structures of FIGS. 3A and 3B construct the respective circuits as shown in FIGS. 2A and 2B.

Even when, in FIGS. 3A and 3B, the electrode 5 extends onto the thick oxide film 6, on inversion layer is induced in the surface of the silicon substrate 1 underneath the thick oxide film because the electric field acting on the surface of the silicon substrate 1 is weakened by this thick oxide film. As a result, the area of the inversion layer in the silicon substrate surface corresponds to the area of the electrode 5 on the thin oxide film 7.

In FIGS. 3A and 3B, the areas of the electrodes 5 differ between both structures. For example, the area of the electrode 5 is made 240 $\mu m^2$ in the structure of FIG. 3A and 120 $\mu m^2$ in the structure of FIG. 3B. As a result, the capacitance of the capacitor $C_{S1}$ in FIG. 2A becomes approximately double the capacitance of the capacitor $C_{S3}$ in FIG. 2B.

Figure 4:
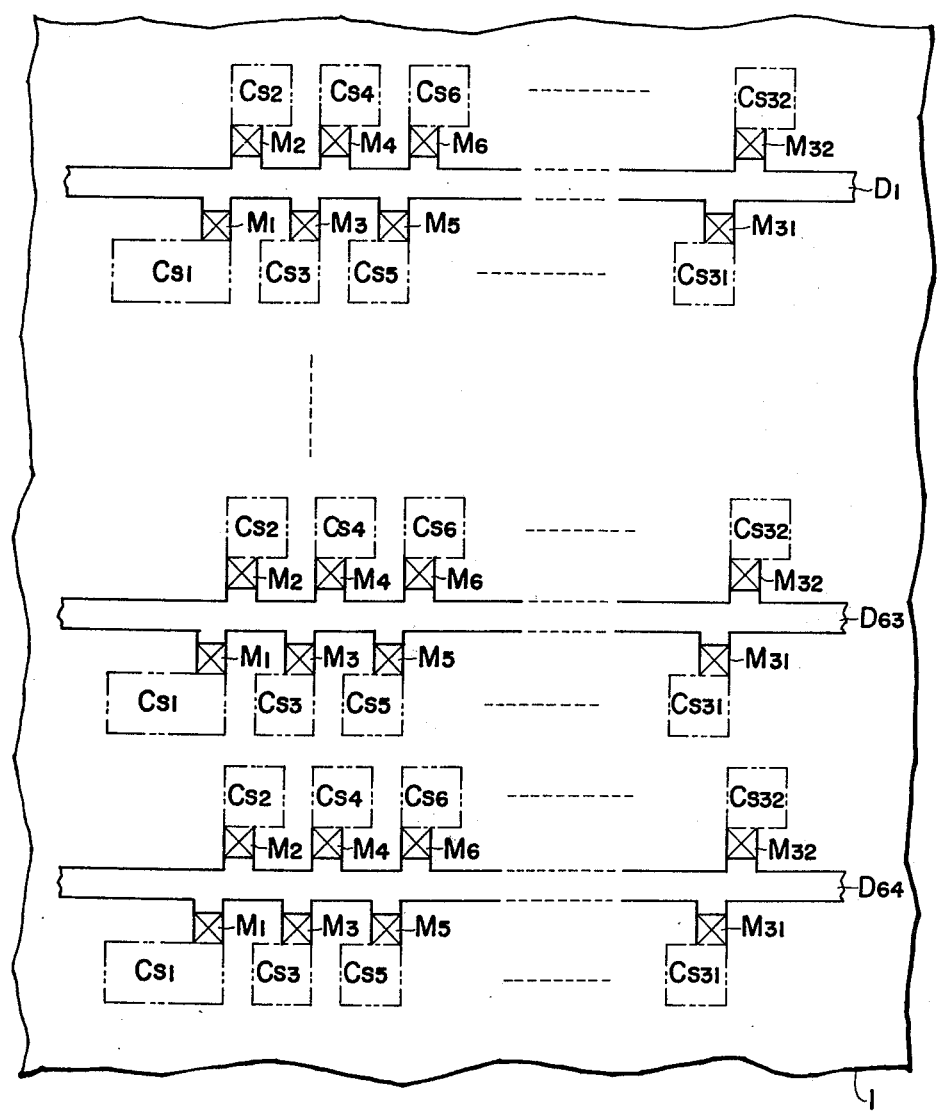
FIG. 4 is a plan view of a dynamic storage device in an embodiment.

In a case where the memory cells including the capacitors of different capacitance values as shown in FIGS. 3A and 3B are used for the memory cell arrays in FIG. 1, the pattern on the silicon substrate 1 becomes as illustrated in FIG. 4.

Referring to FIG. 4, the n-type regions are indicated by solid lines, the gate regions of the MOSFET's by marks X, and the capacitors by one-dot chain lines. In the drawing, one data line, e.g., $D_1$ is formed as one continuous n-type region in the silicon substrate. The capacitors are coupled to this data line through the gate regions.

In FIG. 4, capacitors ($C_{S1}$–$C_{S32}$) belonging to one data line (e.g., $D_{64}$) are arranged alternately on the upper side and the lower side of the data line $D_{64}$ in order to effectively utilize the limited surface. Although no restriction is intended, the area of the capacitors $C_{S1}$ belonging to the corresponding data lines $D_1$–$D_{64}$ at the left end of the memory cell array in FIG. 4 is made double the area of the other capacitors.

The value of the difference in capacitor areas is not fixed, but can be made, for example, 1.5–2 times or more.

According to the above construction, the capacitance of the capacitor of the memory cell at the end portion of the memory cell array becomes larger than that at the central portion, and the quantity of charges which can be accumulated is larger. Therefore, the information holding time at the end portion does not become greatly shorter than that at the central part.

Figure 5A:
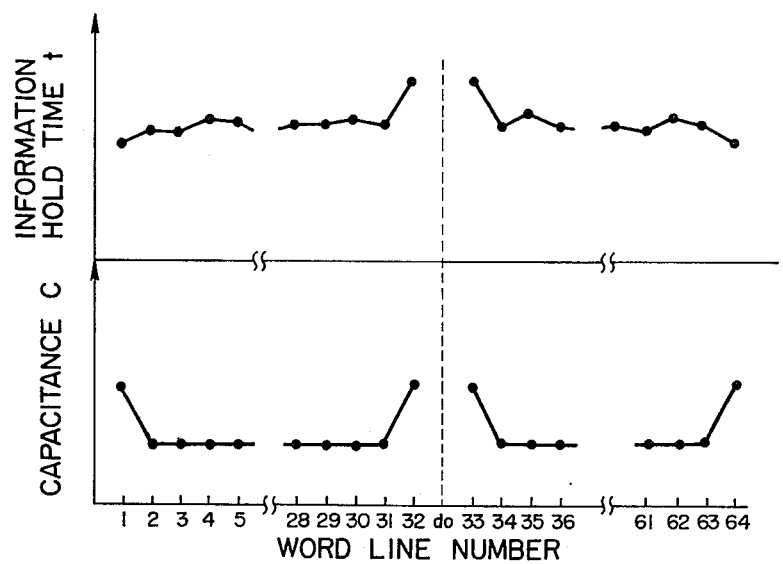
FIGS. 5A and 5B are characteristic diagrams showing the information holding times of memory cells at various portions of a memory cell mat.
Figure 5B:
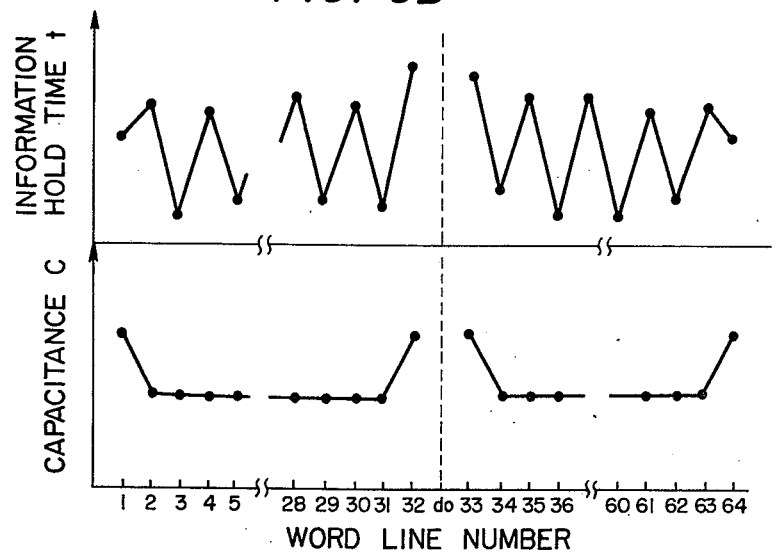

FIGS. 5A and 5B show data on the information holding times of the memory cell array in which the memory cells are arranged alternately as in FIG. 4. FIG. 5A shows the relationship between the information holding time of the memory cells belonging to the data lines $D_{32}$ and $\overline{D_{32}}$ at the central part of the 4K-bit memory shown in FIG. 1 and the capacitance of the capacitors of the memory cells. In the figure, numerals on the abscissa axis represent Nos. of the word lines $W_1$–$W_{64}$. A portion $d_o$ indicated by a broken line at a central portion denotes the pre-amplifier, not the memory cell.

FIG. 5B shows the relationship between the information holding time of the memory cells belonging to the data lines $D_{64}$ and $\overline{D_{64}}$ at the lowermost stage of the memory cell array in FIG. 1 and the capacitance of the capacitors of the memory cells. Regarding the data lines $D_{64}$ and $\overline{D_{64}}$, as apparent from FIG. 4, and considering the arrangement of the memory cells, the capacitors of the memory cells to be respectively selected by the word lines Nos. 1, 3, 5, . . . 31, 32, 33, 34, 36 . . . 60, 62 and 64 are located at the end portion of the memory cell array, and the capacitors of the memory cells to be respectively selected by the word lines Nos. 2, 4, . . . 28, 30, 35, 37 . . . 61, and 63 exist at the inner portion of the memory cell array. As a result, as understood from FIG. 5B, the information holding times of the memory cells which are arranged at the end portion of the memory cell array and which are selected by the word lines Nos. 3, 5, . . . 31, 34, 36 . . . 60, and 62 are short as compared to the information holding times of the memory cells which are arranged at the inner portion of the memory cell array and which are selected by the word lines Nos. 2, 4, . . . 28, 30, 35, 37 . . . 61, and 63. However, the information holding times of the memory cells which are arranged at the end portion but have their capacitances made large and which are selected by the word lines Nos. 1 and 64 are not shortened considerably. Regarding the memory cells on the word lines Nos. 32 and 33, the information holding times lengthen to some extent.

On the data lines $D_{32}$ and $\overline{D_{32}}$, the memory cells to be selected by the word lines $W_1$, $W_{32}$, $W_{33}$ and $W_{64}$ lie at the end portion of the array. Owing to the fact that the capacitor capacitance of the memory cells at the end portion is made double the capacitor capacitance at the inner portion of the array as described previously, the information holding times are made uniform as illustrated in FIG. 5A.

Figure 7:
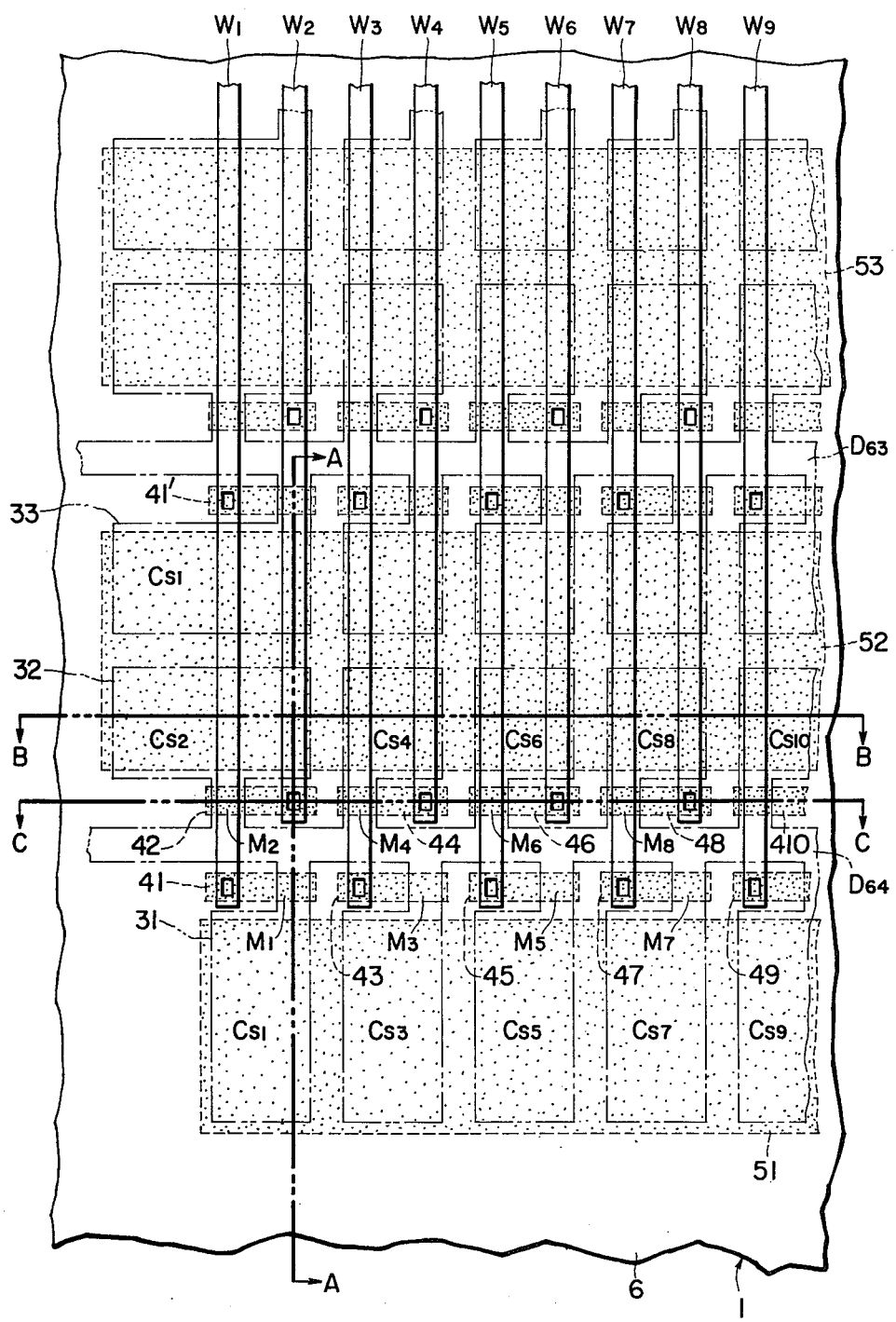
FIG. 7 is a plan view showing a part of a dynamic storage device in another embodiment.

In a dynamic storage device in another embodiment shown in FIG. 7, there is an increase in the capacitances of capacitors in memory cells situated along the entire periphery of a memory cell array, i.e., situated at the right and left end portions as well as the upper and lower end portions of the memory cell array. As a result, the information holding times of every second memory cell on the data lines $D_{64}$ and $\overline{D_{64}}$ at the end portion as illustrated in FIG. 5B are improved in the dynamic storage device of FIG. 7.

In the storage device illustrated in plan in FIG. 7, parts enclosed with one-dot chain lines are impurity diffused regions serving as interconnections, source, drain and gate regions of MOSFET's, and capacitor regions. Parts enclosed with broken lines and dotted in order to facilitate discrimination indicate polycrystalline silicon layers serving as gate electrodes of the MOSFET's and one electrode of each of the capacitors.

Figure 9:
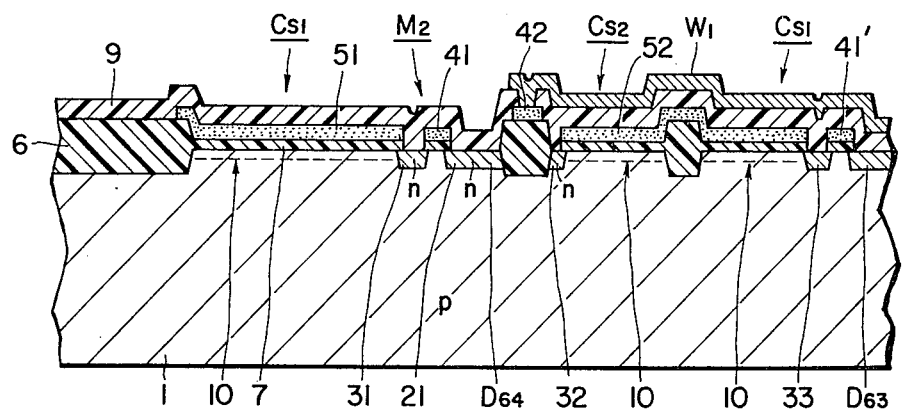
FIGS. 9, 10 and 11 are sectional views of the dynamic storage device taken along lines A — A, B — B and C — C in FIG. 7, respectively.
Figure 10:
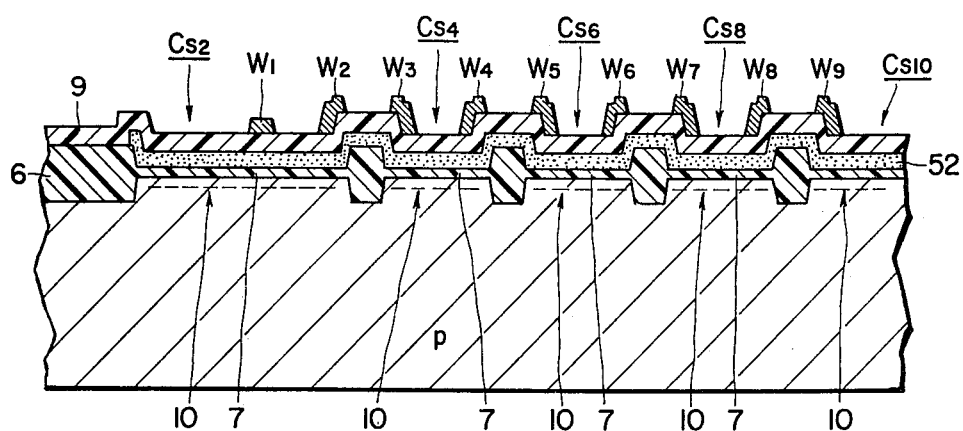
Figure 11:
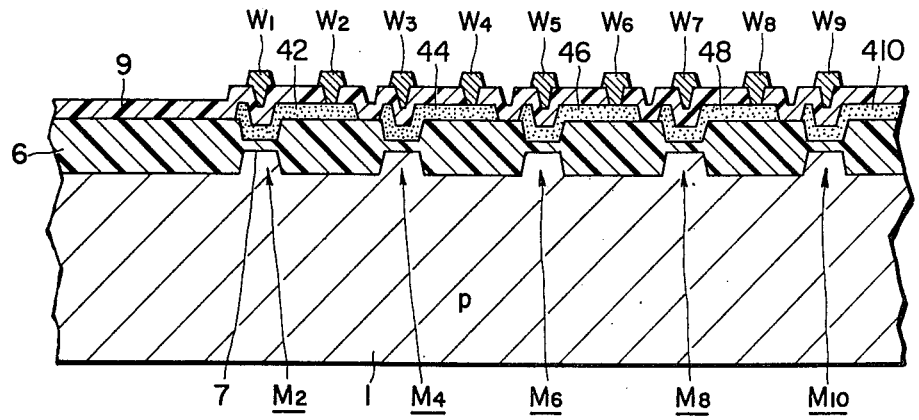

Sectional views taken along lines A — A, B — B and C — C in FIG. 7 are shown in FIG. 9, FIG. 10 and FIG. 11, respectively.

This storage device can be fabricated with the known selective oxidation of silicon technique and the silicon gate technique. Accordingly, various manufacturing steps for the storage device are not illustrated in the drawing, although its fabrication will be outlined below. A p-type silicon substrate 1 having a specific resistance of, for example, 10 Ω.cm is prepared. On those areas of the surface of the silicon substrate which are enclosed within the one-dot chain lines in FIG. 7, an $Si_3N_4$ film is formed. The resultant substrate 1 is heated in an oxidizing atmosphere to form a thick silicon oxide film 6 of a thickness of 1 $\mu$m on that surface of the substrate 1 which is not covered with the $Si_3N_4$ film. The $Si_3N_4$ film on the substrate 1 is removed, and the surface of the substrate 1 with the $Si_3N_4$ film removed therefrom is formed with a thin oxide film 7 of a thickness of 700 Å by the same thermal oxidation as in the above. Subsequently, a polycrystalline silicon layer is deposited on the surface of the substrate 1 to a thickness of 3,500 Å by chemical vapor deposition. In order to bring the polycrystalline silicon layer into the pattern shown by the broken lines in FIG. 7, it is selectively removed by photoetching. Using the remaining polycrystalline silicon layer as a mask, the oxide films 6 and 7 are etched. By this etching, the thin oxide film at the portions which have not been covered with the polycrystalline silicon layer is removed, and the substrate 1 is exposed at those portions. The thick oxide film 6, however, has its surface etched only slightly and remains on the substrate 1.

Phosphorus as an n-type impurity is diffused into the exposed surface of the substrate 1 to form n-type regions 31, 32, $D_{63}$, $D_{64}$, etc. having a depth of 1 $\mu$m and a sheet resistance of 30 Ω/□. At this time, the polycrystalline silicon layer is also turned into the n-type by the phosphorus. Subsequently, the surface of the substrate 1 is covered with a phosphorus glass film 9 which is deposited by chemical vapor deposition. The phosphorus glass film 9 is selectively etched and removed by photoetching to expose the surfaces of the polycrystalline silicon layer indicated at 42 in FIG. 9, the polycrystalline silicon layer to be connected with word lines $W_4$, $W_6$, $W_8$ etc. shown in FIG. 11, etc. Thereafter, an aluminum film is evaporated on the entire surface of the substrate 1, and it is photoetched. As a result, the word lines $W_1$ to $W_8$ made of the aluminum film are left on the substrate surface as shown in FIG. 7.

A positive voltage of a power source $V_{DD}$ (not shown) is applied to the polycrystalline silicon layers 51, 52 and 53 shown in FIG. 7, and inversion layers which form one-side electrodes of the capacitors are induced in the surface of the substrate 1 as defines interfaces with the thin oxide film 7 underneath the polycrystalline silicon layers. Such inversion layers are represented by reference numeral 10 in FIGS. 9 and 10.

The polycrystalline silicon layer at, e.g., 51 as forms the other electrode of the capacitor, the polycrystalline silicon layer at, e.g., 41 as forms the gate electrode of the MOSFET, and so forth, act as impurity diffusion masks at the diffusion of phosphorus. As a result, the n-type region 31 which functions as the source or drain of the MOSFET $M_2$ and the n-type region 21 which functions as the drain or source thereof are precisely aligned with the polycrystalline silicon layer 41 serving as the gate electrode as illustrated in FIG. 9. The inversion layer 10 connects with the n-type region 31. The n-type region 21 of the MOSFET $M_2$ connects with the n-type region $D_{64}$ serving as the data line. As apparent from FIG. 7, the polycrystalline silicon layer 41 connects at the portion of the thick oxide film 6, with the aluminum layer $W_1$ forming the word line.

Figure 8:
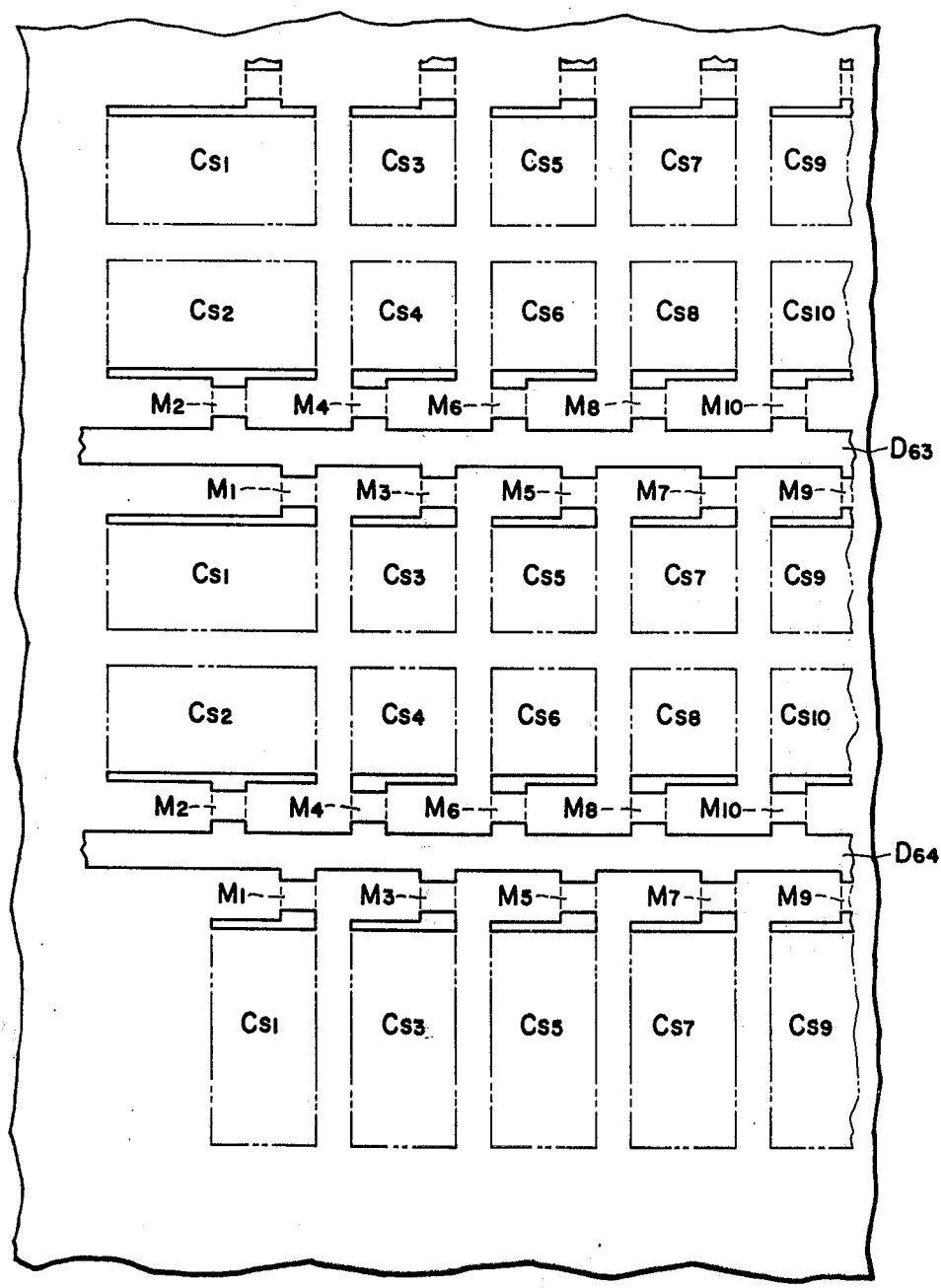
FIG. 8 is a plan view showing the patterns of diffused regions as interconnections and source and drain regions of MOSFET's, gate regions of the MOSFET's and capacitor regions in the dynamic storage device of FIG. 7.

In order to further facilitate understanding of the dynamic storage device of FIG. 7, the n-type regions, gate regions and capacitor regions are shown in the plan view of FIG. 8. In FIG. 8, the n-type regions are indicated by solid lines, the gate regions by the combination of solid lines and broken lines, and the capacitor regions by solid lines and one-dot chain lines.

In accordance with this invention, the foregoing embodiments can be modified. Such modified embodiments are respectively shown in FIGS. 12 and 13.

Figure 12:
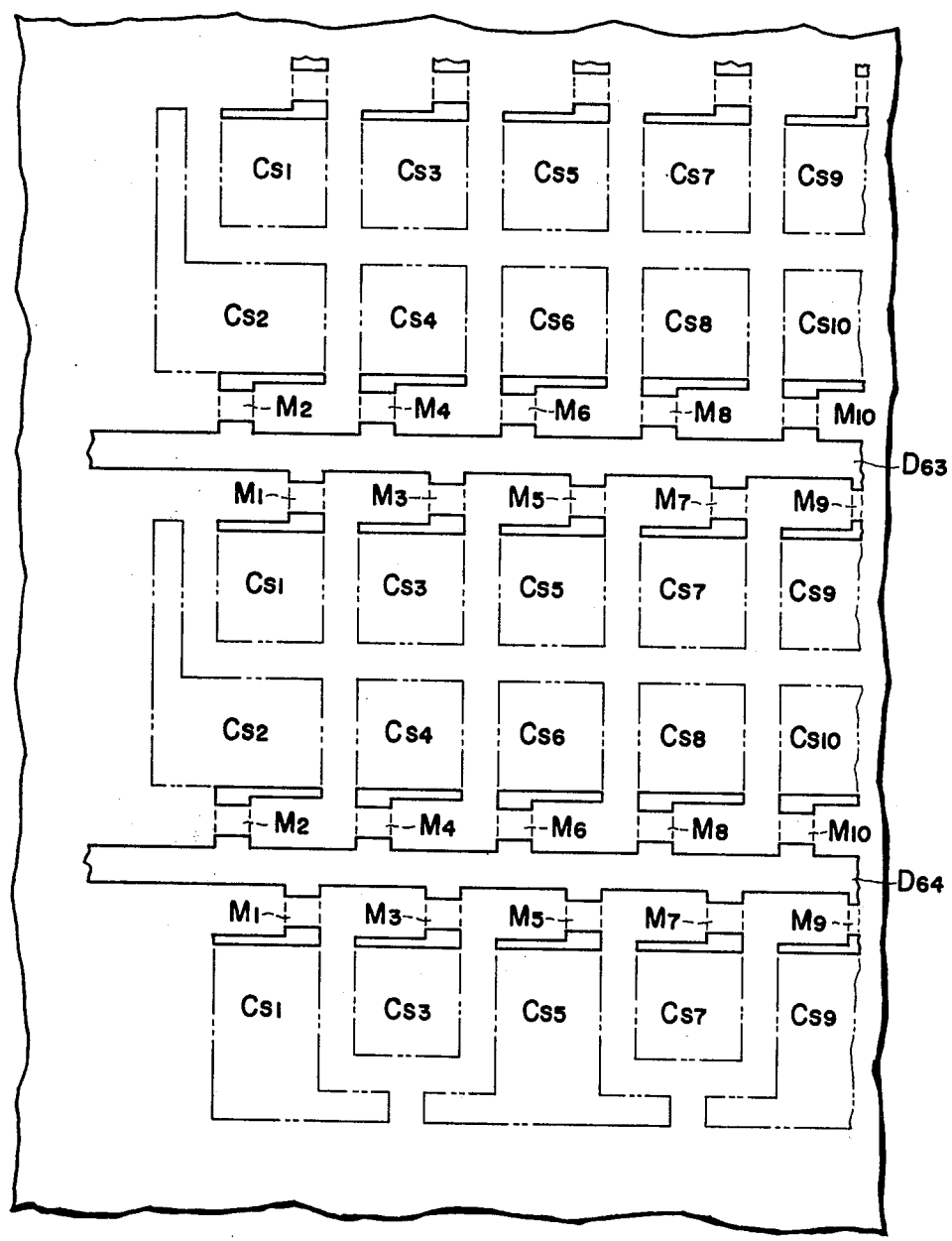
FIG. 12 is a plan view showing the patterns of diffused regions as interconnections and source and drain regions of MOSFET's, gate regions of the MOSFET's and capacitor regions in a dynamic storage device in another embodiment.

The plan view of the embodiment shown in FIG. 12 has been prepared by the same method as in FIG. 8. In this embodiment, some of the capacitors of memory cells situated at the end portion of a memory cell mat are transformed. For example, the capacitor $C_{S2}$ of the memory cell belonging to the data line $D_{64}$ extends onto a side of the capacitor $C_{S1}$ of the memory cell belonging to the data line $D_{63}$. In this example, a part of the capacitor $C_{S2}$ belonging to the data line $D_{64}$ achieves an effect equivalent to a substantial memory cell being arranged around the capacitor $C_{S1}$ belonging to the data line $D_{63}$. In consequence, the capacitor $C_{S1}$ belonging to the data line $D_{63}$ conducts a satisfactory information holding operation without increasing the capacitance thereof.

Capacitors $C_{S3}$ and $C_{S7}$ belonging to the data line $D_{64}$ are similarly surrounded by parts of capacitors $C_{S1}$, $C_{S5}$ and $C_{S9}$.

In the embodiment of FIG. 12, the number of capacitors whose capacitances are to be increased can be limited.

Figure 13:
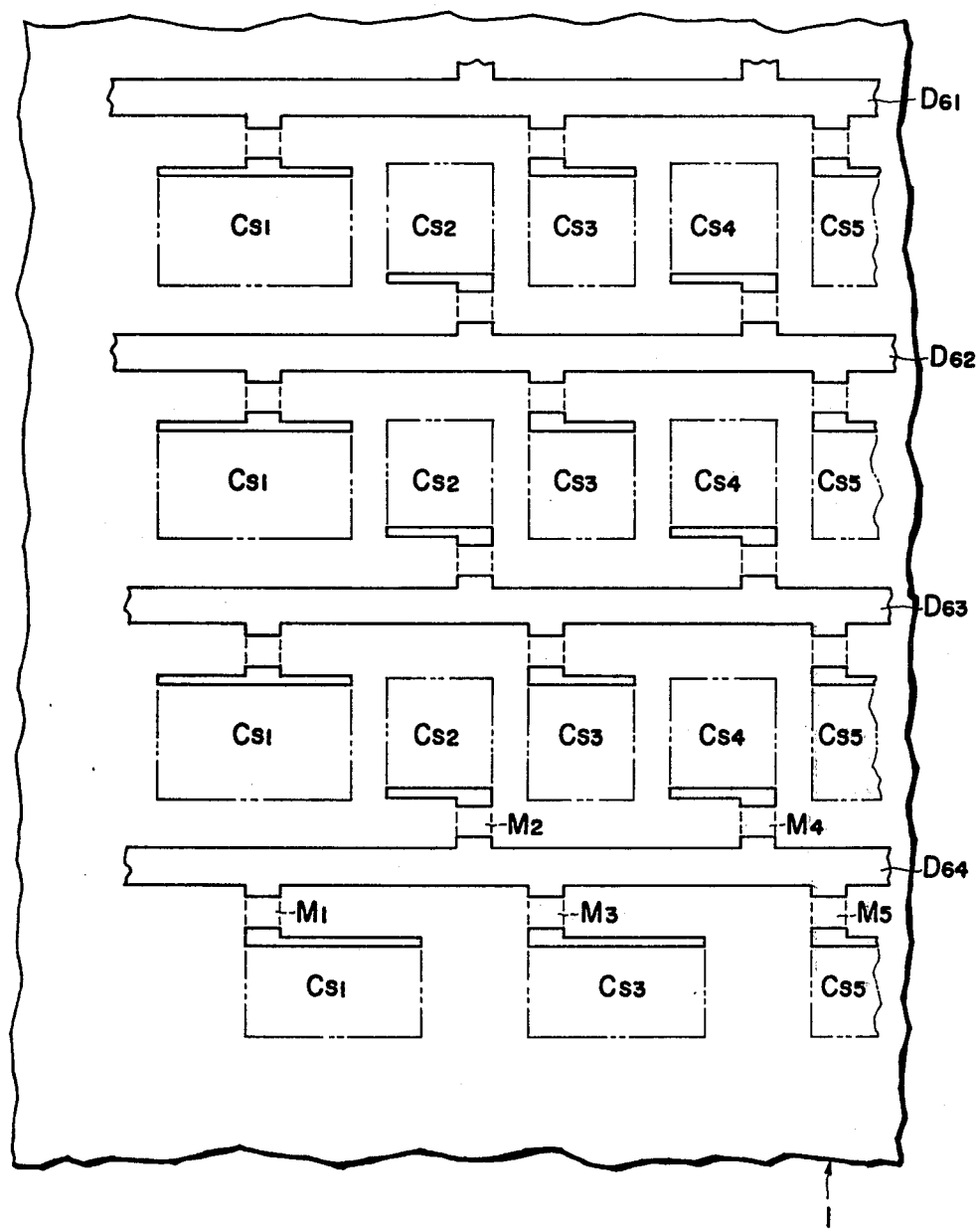
FIG. 13 is a plan view of a further embodiment and is similar to FIG. 12.

In the further embodiment shown in FIG. 13, a memory cell of one data line, e.g., $D_{63}$ is arranged between memory cells of another data line $D_{64}$. According to this embodiment, a sufficient spacing can be provided between the memory cells at the end portion of a memory cell array, and hence, the capacitor capacitances of the memory cells at the end portion can be easily enlarged.

This invention is not restricted to the foregoing embodiments, but can employ a variety of modifications.

For example, in the foregoing embodiments, the area of the electrode of a capacitor is increased in order to enlarge the capacitance of the capacitor. This is not restrictive, and an oxide film serving as a dielectric may be thinned.

This invention is extensively applicable to a dynamic storage device such as a 1-element memory which reads out stored information by directly taking out charges accumulated in a capacitior.

We claim:

1. A dynamic storage device comprising a memory cell array constructed of a plurality of memory cells arrayed on a semiconductor substrate, said each memory cell including a capacitor which is made up of a semiconductor region in a surface of said semiconductor substrate and a conductor layer formed on said semiconductor region through an insulating film and an insulated gate field-effect transistor whose source region or drain region is connected to said semiconductor region, the capacitors of the memory cells at an end portion of said memory cell array having capacitances larger than those of the capacitors of the memory cells at an inner portion of said memory cell array.

2. A dynamic storage device according to claim 1, wherein said each memory cell is constructed of a 1-element cell.

3. A dynamic storage device according to claim 1, wherein a plurality of data lines are arranged in said memory cell array, the memory cells are caused to alternately belong to both sides of the data lines, and the capacitances of the capacitors of the memory cells which belong to one side of the data line and which lie at the end portion of said memory cell array are increased.

* * * * *